United States Patent [19]

Tomita

[11] Patent Number: 5,270,655
[45] Date of Patent: Dec. 14, 1993

[54] SEMICONDUCTOR INTEGRATED CIRCUIT HAVING LIGHT EMITTING DEVICES

[75] Inventor: Yasuhiro Tomita, Sanda, Japan

[73] Assignee: Matsushita Electric Industrial Co., Ltd., Kadoma, Japan

[21] Appl. No.: 769,402

[22] Filed: Oct. 1, 1991

Related U.S. Application Data

[62] Division of Ser. No. 630,030, Dec. 19, 1990, Pat. No. 5,105,235.

[30] Foreign Application Priority Data

Dec. 22, 1989 [JP] Japan .................................. 1-333794

[51] Int. Cl.$^5$ .................................................. G01R 31/28
[52] U.S. Cl. ................................. 324/158 R; 324/501
[58] Field of Search .............. 324/158 R, 158 F, 501, 324/537; 358/106; 340/595

[56] References Cited

U.S. PATENT DOCUMENTS

| | | | |
|---|---|---|---|
| 3,991,302 | 11/1976 | Danner | 340/595 |
| 4,389,669 | 6/1983 | Epstein et al. | 358/106 |
| 4,680,635 | 7/1987 | Khurana | 358/106 |
| 4,755,874 | 7/1988 | Esrig et al. | 358/106 |
| 4,758,782 | 7/1988 | Kobayashi | 358/106 |
| 4,999,577 | 3/1991 | Beha et al. | 324/501 |

FOREIGN PATENT DOCUMENTS 2170068 7/1986 United Kingdom ................ 324/501

*Primary Examiner*—Ernest F. Karlsen
*Attorney, Agent, or Firm*—Ratner & Prestia

[57] ABSTRACT

The light emitting device has a series circuit comprised of a MOS transistor and a P+N+ junction. When a voltage greater than the breakdown voltage of the P+N+ junction is applied to this series circuit, as well as putting the MOS transistor into a conductive state, the P+N+ junction breaks down allowing a breakdown current to flow, and weak light is generated from the P+N+ junction. Since this light emitting device can be produced in nearly the same size as an MOS transistor, using a conventional CMOS technique, it can be integrated into a chip with a high integration level, and the integration of the light emitting device causes almost no drop in the integration level. When this light emitting device is integrated in a semiconductor integrated circuit, the state of the circuit can be easily monitored by observing the light pattern of the device.

4 Claims, 8 Drawing Sheets

SEMICONDUCTOR INTEGRATED CIRCUIT HAVING LIGHT EMITTING DEVICES

This application is a division, of application Ser. No. 07/630,030, filed Dec. 19, 1990 now U.S. Pat. No. 5,105,235.

BACKGROUND OF THE INVENTION

1. Field of the Invention

This invention relates to a light emitting device which can be integrated in a semiconductor integrated circuit, a semiconductor integrated circuit which can be readily subjected to a functional test, failure analysis, debugging or the like, and an apparatus for testing such a semiconductor integrated circuit.

2. Description of the Prior Art

When a semiconductor integrated circuit (hereinafter, referred to as "chip") is subjected to a functional test, test patterns and test results are input or output through a limited number of input buffers and output buffers which are disposed in the periphery of the chip. The number of these input buffers and output buffers (hereinafter, referred to as "pads") is restricted by the area of the chip.

In recent microprocessors or the like, the unit of process has increased to 32 bits or 64 bits, and thus the number of test patterns, and internal signal lines in the chip which need to be monitored have increased in number. Furthermore, as the degree of integration has increased, the internal structure of the chip has also become more complicated, and the types of signal lines which need to be monitored have also risen in number. It is difficult to bring these signals out to the pads as they are, due to the number of lines and the limitations of circuits which can be used for circuit testing.

In order to reduce the number of pads which are used for testing, the scan path method is proposed in which signals that are processed in parallel inside the chip are converted to a string of serial signals using shift registers, and then delivered outside the chip or vice versa. In other proposed methods, the signal lines within the chip which are monitored by the output pads are restricted, and when it is necessary to check signal lines other than these, the signal lines are touched directly with a probe or measured with an electron beam tester.

However, signal measurement by touching signal lines directly with a probe cannot be performed accurately in the most recent chips, wherein the wiring width has been refined to about 1 μm, because it is not easy to establish a good electrical contact between the wiring and the probe. Furthermore, it is difficult to perform measurement with good repeatability and without breaking the wiring. There are techniques for accumulated formation of large electrodes on fine wirings with FIB (Focused Ion Beam) apparatus etc., but these techniques are not suited for monitoring a large number of signals due to factors such as the formation time.

Further, as regards an electron beam tester, since measurement is performed by sampling signals with an electronic beam pulse in the direction of the time axis, a repeating test pattern is required, therefore measurement accuracy decreases with the increase of the size of a test pattern. For this reason, in the measurement of chips having a large logical depth, it is not possible to use a sufficiently large test pattern, and thus there is a limit to the kinds of functional tests which can be performed. Skill and substantially great amount of adjusting time are required to obtain a stable output waveform. Furthermore, an electron beam tester leads to high measurement costs, because it is expensive and has a vacuum system which is troublesome to maintain.

SUMMARY OF THE INVENTION

The light emitting device of this invention, which overcomes the above-discussed and numerous other disadvantages and deficiencies of the prior art, comprises: a MOS transistor; a first heavily doped region of a first conductivity type, said first heavily doped region functioning as the source region of said MOS transistor; a second heavily doped region of a second conductivity type, said second heavily doped region being adjacent to said first heavily doped region; a P+N+ junction formed between said first and second heavily doped regions; and means for supplying a voltage between the drain electrode and said second heavily doped region, said voltage being greater than the breakdown voltage of said P+N+ junction.

In preferred embodiments, said device further comprises control means for controlling the voltage applied to the gate electrode of said MOS transistor.

In another aspect of the invention, a semiconductor integrated circuit comprises: an internal main circuit; at least one light emitting device, said internal main circuit and light emitting device being integrated; and means for supplying a signal to said light emitting device, said signal being output from said internal main circuit, whereby the lighting of said light emitting device is controlled to indicate the state of said internal main circuit.

In a further aspect of the invention, a semiconductor integrated circuit comprises: at least one internal bus; at least one light emitting device, said internal bus and light emitting device being integrated; and means for supplying a signal to said light emitting device, said signal corresponding to at least one of data of said internal bus and the control signal therefor, whereby the lighting of said light emitting device is controlled to indicate the logic state of said internal bus and control signal.

In a still further aspect of the invention, a semiconductor integrated circuit comprises: an internal main circuit, said internal main circuit including a internal main function circuit, and a test circuit; at least one light emitting device, said internal main circuit and light emitting device being integrated; and means for supplying a signal to said light emitting device, said signal being output from said test circuit, whereby the lighting of said light emitting device is controlled to indicate the logic state of the outputs of said test circuit.

In a still further aspect of the invention, a semiconductor integrated circuit comprises: an internal main circuit, said internal main circuit including a combinational logic circuit, and a state transition circuit having registers, said registers being in a feedback loop of said state transition circuit; at least one light emitting device, said internal main circuit and light emitting device being integrated; and means for supplying a signal to said light emitting device, said signal being output from said state registers, whereby the lighting of said light emitting device is controlled to indicate the logic state of said resisters.

In a still further aspect of the invention, a semiconductor integrated circuit comprises: a plurality of signal lines; a selector for selecting one of said signal lines in accordance with a control signal; a latch for sampling the output of said selector in accordance with another control signal; at least one light emitting device; and means for supplying a signal to said light emitting device, said signal being output from said latch, whereby the lighting of said light emitting device is controlled to indicate the logic state of outputs of said latch.

In a still further aspect of the invention, a semiconductor integrated circuit comprises: a plurality of signal lines; a selector for selecting one of said signal lines in accordance with a control signal; at least one light emitting device; and means for supplying a signal to said light emitting device, said signal being output from said selector, whereby the lighting of said light emitting device is controlled to indicate the logic state of outputs of said selector.

The above semiconductor integrated circuits may further comprise means for forcibly suppressing the lighting of said light emitting device.

The test apparatus for testing a semiconductor integrated circuit in which at least one light emitting device is integrated, comprises: a pattern generator for generating a test pattern to produce a light pattern at said light emitting device; optical means for converting light emitted from said light emitting device into electric signals, the operation period of said optical means being controllable; and control means for controlling the operation period of said optical means, thereby obtaining a desired portion of said light pattern.

Thus, the invention described herein makes possible the objectives of:

(1) providing a light emitting device which can be integrated with a degree of integration which is substantially the same as that of a MOS transistor;

(2) providing a semiconductor integrated circuit in which the logical state or the like can be easily monitored, without impairing the degree of integration;

(3) providing a semiconductor integrated circuit which can shorten the time required for tasks such as failure analysis, debugging and functional testing, without impairing the degree of integration; and (4) providing an apparatus for testing a semiconductor integrated circuit which can easily perform tasks such as failure analysis, debugging and functional testing for the semiconductor integrated circuit.

The light emitting device according to the invention has a series circuit comprising of a MOS transistor and a P+N+ junction. When a voltage greater than the breakdown voltage of the P+N+ junction is applied to this series circuit, as well as putting the MOS transistor into a conductive state, the P+N+ junction breaks down allowing a breakdown current to flow, and weak light is generated from the P+N+ junction. The inventor observed that weak near-infrared light emitted from the P+N+ junction. By adequately selecting the material of the device, the wavelength of light emitted from the P+N+ junction can be changed. Since this light emitting device can be produced in nearly the same size as a MOS transistor, using a conventional CMOS technique, it can be integrated into a chip with a high integration level, and the integration of the light emitting device causes almost no drop in the integration level.

The semiconductor integrated circuit of the invention can indicate the state of the internal main circuit with a combination of two states of the light emitting device, namely emission and non-emission, by controlling the gate electrode of the MOS transistor in the light emitting device, which is integrated into the chip, using the desired state of the chip's internal main circuit. As a result of this, the logic states of the chip's internal signals can be easily monitored, and the time required for tasks such as failure analysis, debugging and functional testing can be shortened.

Further, it is possible to simultaneously observe the logic states of a large number of signal lines in an internal main circuit by means of emission and non-emission patterns of light emitting devices. This makes it possible to easily perform tasks which require the checking of many signals, such as functional testing, failure analysis and debugging, and to greatly reduce the amount of time required for tasks such as functional testing, failure analysis and debugging. Hence, the cost of these analyses can be reduced.

The reduction in performance resulting from the increase in circuit area and the increase in stray capacitance, due to the integration of light emitting devices into a semiconductor integrated circuit, is slight, and therefore this is not a problem when compared with the merits of cost reduction.

The test apparatus of the invention is able to sample just those items which need to be observed from the emission/non-emission patterns of the time series which accompanies the operation corresponding to the test pattern of the semiconductor integrated circuit. This makes it possible to quickly and easily implement analyses of a semiconductor integrated circuit, and to substantially increase the efficiency of these tasks.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1A:
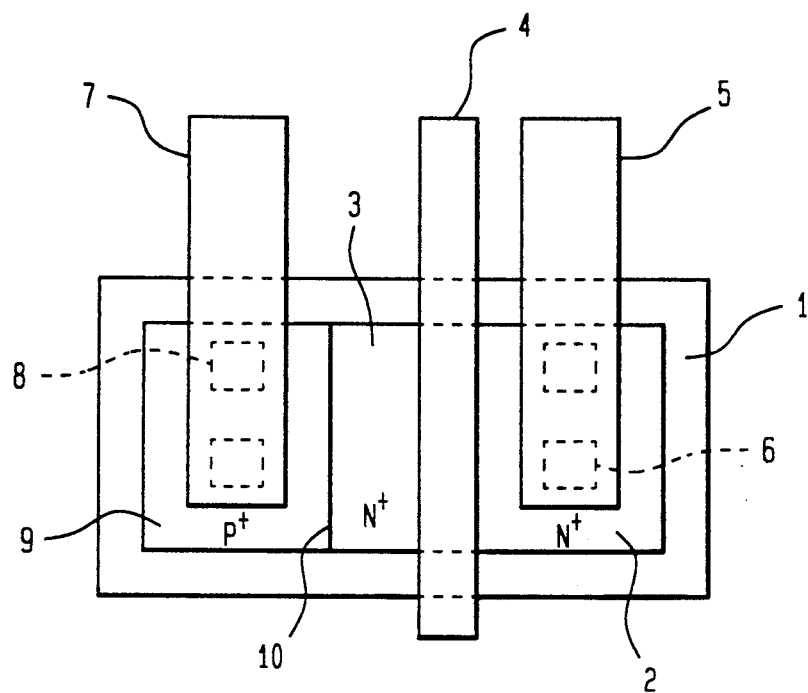
FIG. 1A is a plan view diagrammatically illustrating a light emitting device according to the invention.
Figure 1B:
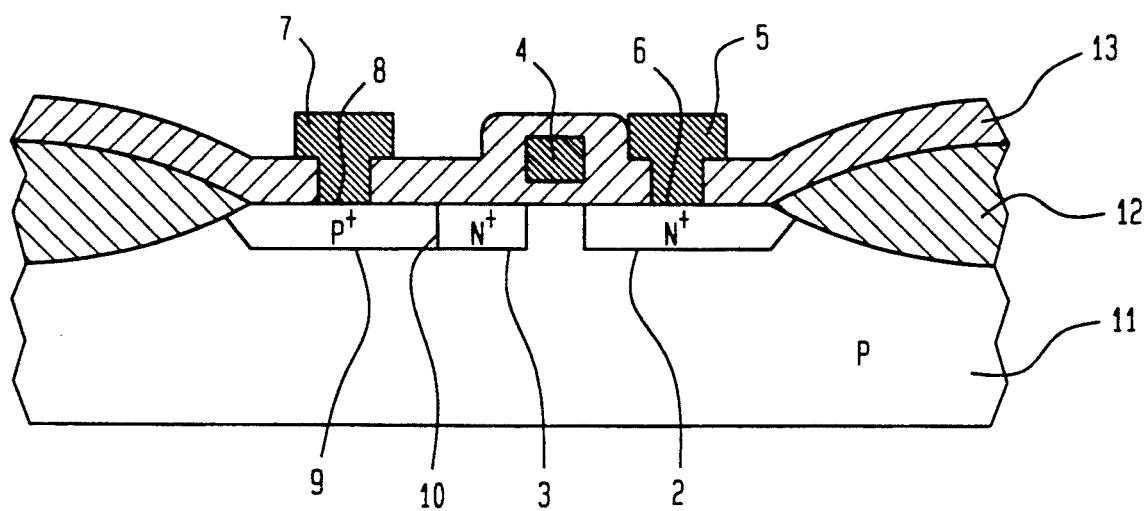
FIG. 1B is a sectional view of the light emitting device of FIG. 1A.

FIG. 1A shows a light emitting device according to the invention. The light emitting device of FIG. 1A can be produced by a conventional CMOS process, and comprises an isolation region 1 formed on a P-type substrate 11. In the isolation region 1, an N-type MOS transistor and a light-emitting region are formed. The drain region and source region of the N-type MOS transistor are formed respectively in N+ doped regions 2 and 3. A gate electrode 4 of the MOS transistor is made of polysilicon. FIG. 1B shows a cross-section of the light emitting device.

An aluminum wiring 5 is connected via contact holes 6 to the drain region of the MOS transistor (the N+ doped region 2). An aluminum wiring 7 is connected via contact holes 8 to a P+ doped region 9 which has the conductivity type opposite to that of the source region of the MOS transistor (the N+ doped region 3). The P+ doped region 9 is formed so as to be adjacent to the N+ doped region 3 which is the source region of the MOS transistor as mentioned above, and a P+N+ junction 10 is formed at the interface between the N+ doped region 3 and the P+ doped region 9. In FIG. 1B, 12 is a filed oxide, and 13 is an insulating film.

The P+ doped region 9 which is necessary to form this light emitting device is formed at the same time as the formation of doped regions which function as the drain and source regions of P-type MOS transistors.

According to the invention, the light emitting device may be formed by using a P-type MOS transistor. In this case, the highly doped region 9 has the opposite conductivity type (i.e., N+).

In the light emitting device of FIG. 1A, a voltage is applied between the aluminum wirings 7 and 5 so that the P+N+ junction 10 is reversely biased, and the MOS type transistor is turned ON by controlling the voltage of the gate electrode 4. When a voltage greater than the breakdown voltage of the P+N+ junction 10 is applied, the P+N+ junction 10 breaks down and the breakdown current flows. The amount of the breakdown current is limited by the current drive capacity of the MOS transistor. In the embodiment, as a result, weak near-infrared light is generated from the vicinity of the P+N+ junction 10.

It is possible to observe this weak emission of near-infrared light with a highly sensitive image pickup device used in a hot carrier analysis apparatus (for example, EMMI manufactured by KLA Instrument Corporation, Calif., U.S.A.). In the embodiment produced under conditions that the impurity density of the P+ doped region 9 is $6 \times 10^{19}/cm^3$ and that of the N+ doped region 3 is $3 \times 10^{20}/cm^3$, near-infrared light having the wavelength of about 1 $\mu$m was observed after the breakdown with a reverse bias of 4 V or less.

Figure 10A:
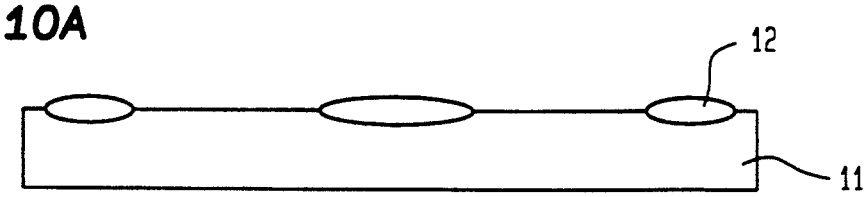
FIGS. 10A to 10E illustrate the steps of producing the light emitting device of FIG. 1A.
Figure 10B:
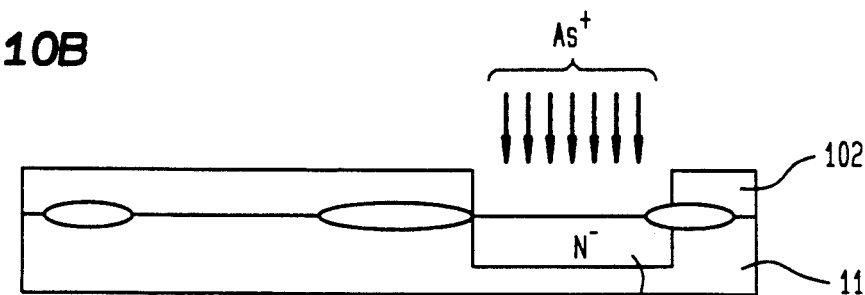
Figure 10C:
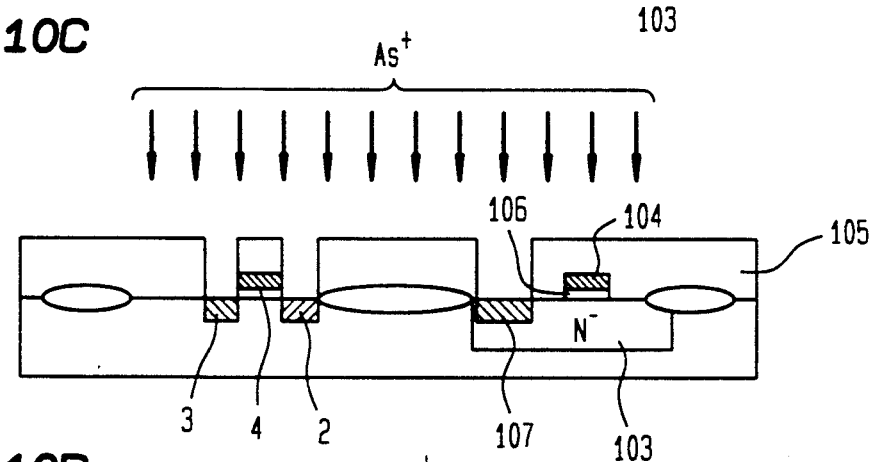
Figure 10D:
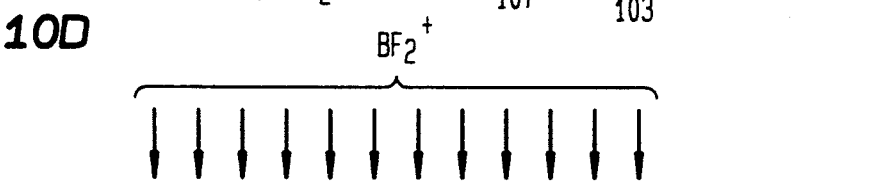
Figure 10E:
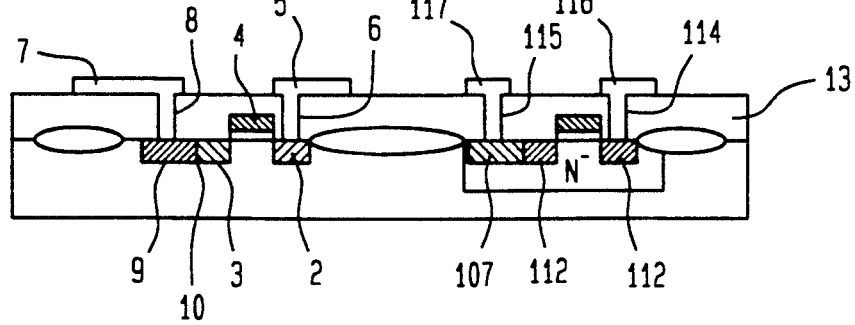

The production process of the light emitting device of FIG. 1A will be briefly described with reference to FIGS. 10A to 10E. The light emitting device was produced by using the N-well CMOS type process First, a field oxide 12 was formed on the P-type silicon substrate 11 (FIG. 10A). Using a patterned photoresist 102 as a mask, As+ ion was implanted with a dose of about $10^{13}/cm^2$ to form an N-well 103 (FIG. 10B). A gate oxide 106 and polysilicon gate 104 were formed by a well-known technique. Using a photoresist 105 as a mask, As+ (N type impurity) ion was implanted with a dose of about $10^{15}/cm^2$ and energy of about 60 keV, whereby the source and drain regions 3 and 2 of the N-type MOS transistor were formed and simultaneously an N+ region 107 was formed on the N-well 103 (FIG. 10C). BF$_2$+ (P type impurity) ion was implanted with a dose of about $10^{15}/cm^2$ and energy of about 40 keV using a photoresist 109 as a mask, whereby the P+ doped region 9 was formed and source and drain regions 112 of a P-type MOS transistor were also formed (FIG. 10D). At this time, the P+N+ junction 10 was formed. When annealed at 900° C. and for 70 min., the diffusion depth of the P+ regions was about 0.45 $\mu$m, and that of the N+ regions about 0.25 $\mu$m. Preferably, the P+N+ junction 10 has a length of several al $\mu$m to several tens $\mu$m. Thereafter, the insulating film 13 was deposited by the CVD technique, and contact holes 6, 8, 114 and 115 were formed. Aluminum wirings 5, 7, 116 and 117 were formed to make electrical contacts. In this way, two light emitting devices having MOS transistors of different conductivity types can be formed simultaneously.

The size of the light emitting device is substantially the same as that of a MOS transistor. Therefore, the light emitting device of this invention can be integrated in a CMOS semiconductor integrated circuit with an integration level, while causing almost no drop in the integration level of the semiconductor integrated circuit. Furthermore, the increase of the stray capacitance which is caused by driving the light emitting device is the degree of the gate capacity of a small MOS transistor (for example, a channel length of 1 $\mu$m and a channel width of 5 $\mu$m).

Figure 2:
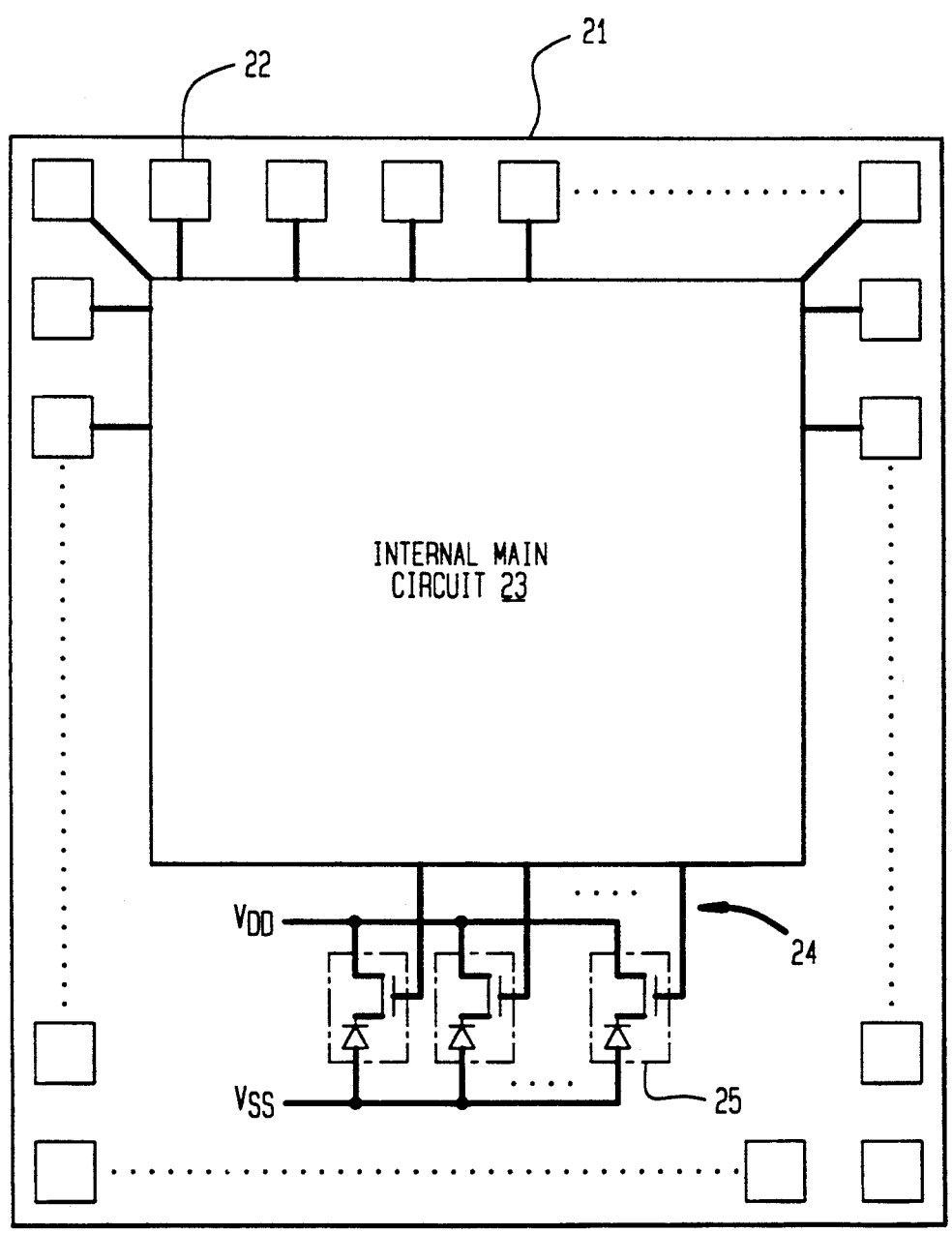
FIG. 2 diagrammatically shows a semiconductor integrated circuit according to the invention.

FIG. 2 shows a semiconductor integrated circuit according to the invention. A semiconductor integrated circuit 21 of this embodiment operates while exchanging signals between the outside and an internal main circuit 23 via pads 22. In this embodiment, a plurality of light emitting devices 25 which have the structure substantially the same as that of the device of FIG. 1A are arranged in a row. The drain and source of each of the light emitting devices 25 are connected voltage sources $V_{DD}$ and $V_{SS}$ of the CMOS semiconductor circuit, respectively. The gate of each of the light emitting devices 25 is connected to the internal main circuit 23 through a respective signal line 24. The state of each of the signal lines 24 changes in accordance with the logic states of the internal main circuit 23. Therefore, the logic states of the internal main circuit 23 can be indicated through combinations of light emission and non-light emission from the light emitting devices 25.

In the prior art, tasks such as failure analysis, functional testing and debugging of the internal main circuit 23 were usually performed via the pads 22, and when it became necessary to observe signals which were not available there, a probe or electron beam tester etc. was used, or the internal signal lines of the internal main circuit 23 were checked directly by providing small pads for signal observation. However, this prior art method is not suitable from the standpoint of cost, since much time is required to simultaneously observe a large number of signals. Furthermore, pads which are large enough to be touched with a probe cannot be provided oh all of the required nodes of the internal main circuit 23, because the provision of such pads causes an increased chip size and an increased stray capacitance, which results in a drop in the performance of the circuit.

In contrast, the size of the light emitting devices 25 used in this embodiment is about the same as that of a MOS transistor, and they can be integrated with a high integration level. Even when a sufficient number of the light emitting devices 25 are formed in the required locations of the internal main circuit 23, the increase in the size of the chip is very small, and a drop in the performance of the circuit is also not a problem. Furthermore, according to this embodiment, it is possible to simultaneously check a large number of signals by observation of a television image, and thus it is possible to greatly improve the efficiency of tasks such as failure analysis, functional testing and debugging of the circuit.

In this embodiment, devices of FIG. 1A are used as the light emitting devices 25. Alternatively, MOS transistors having a short channel may be used as light emitting devices 25. In this case, the ON/OFF state of the MOS transistors is controlled depending upon the state of the internal main circuit 23, and the same effect can be achieved by detecting the emission of near-infrared light caused by hot carriers which generate at the ON state of the MOS transistor. In this alternative embodiment, the size of the light emitting devices 25 can be further decreased as compared with that of the device of FIG. 1A, with the result that the light emitting devices 25 can be integrated with a higher integration level. According to the invention, compound semiconductor light emitting devices (such as GaAs LEDs) may be used as the light emitting devices 25 to enhance the intensity of the light emission, which effectively increases the easiness and reliability of the tests of the circuits. The kind of the light emitting devices 25 is not restricted to those described above, and may be widely selected from known devices which can be integrated.

Figure 3:
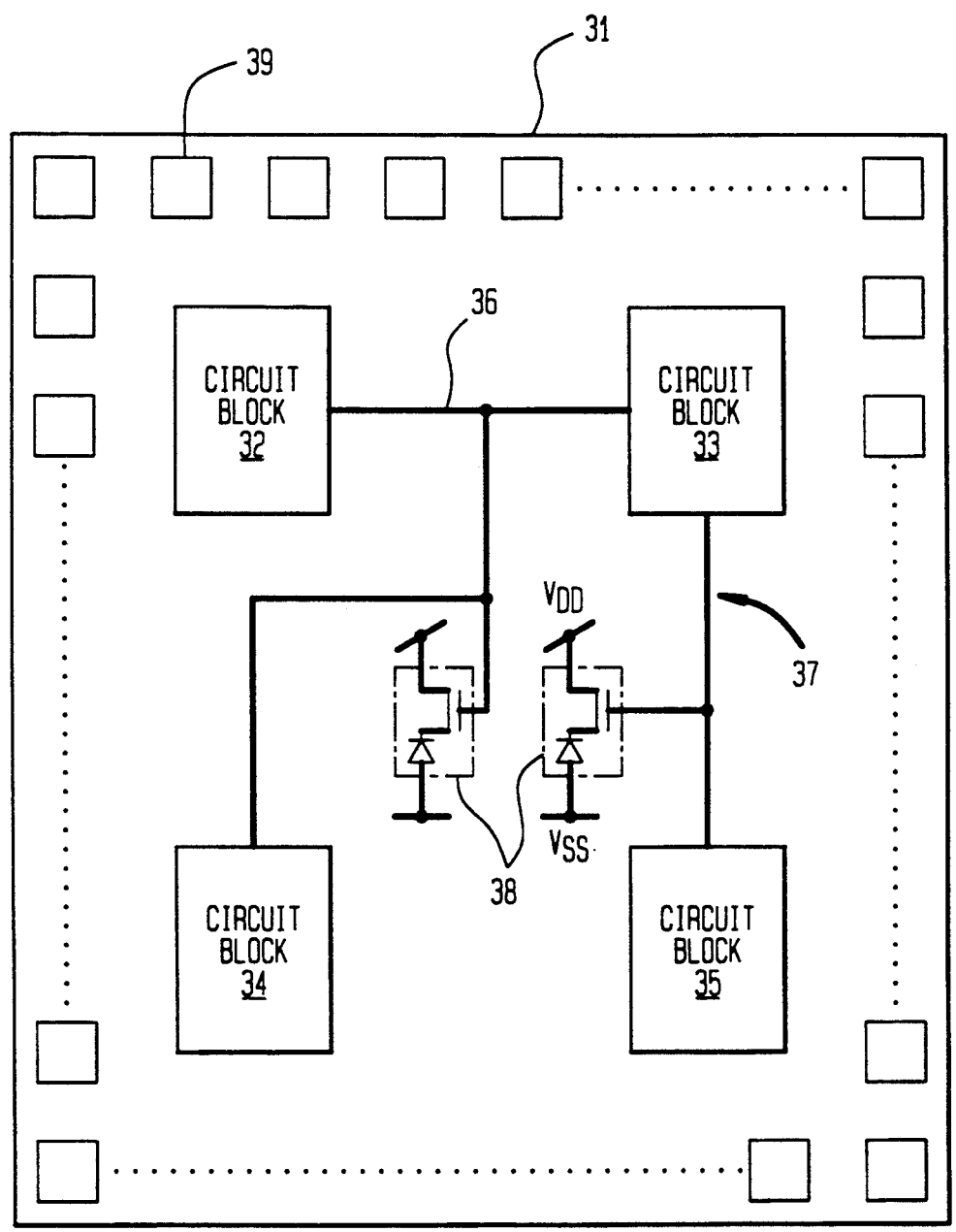
FIGS. 3 to 7 diagrammatically show other semiconductor integrated circuits according to the invention.

FIG. 3 shows another semiconductor integrated circuit according to the invention. In this embodiment, a semiconductor integrated circuit 31 comprises four circuit blocks 32 to 35 which constitute an internal main circuit. The circuit blocks 32, 33 and 34 are linked by an internal bus and its control signals 36, while the circuit blocks 33 and 35 are linked by an internal bus and its control signals 37.

Individual signal lines for the internal buses and their control signals 36 and 37 are connected to the gate electrodes of MOS transistors in light emitting devices 38 each having the structure shown in FIG. 1A. Logic states of the circuit 31 can be indicated through patterns of emission and non-emission of light from the light emitting devices 38. In FIG. 3, the reference numeral 39 indicates pads.

This embodiment is constructed so that the states of the internal buses and their control signals 36 and 37 can be checked easily in a short period of time. By adopting this construction, it becomes possible to rapidly check the input/output signals for each of the circuit blocks 32 to 35, and thus it is possible to greatly improve the efficiency of tasks such as functional testing, failure analysis and debugging for the semiconductor integrated circuit 31 which has a structure wherein the multiple circuit blocks 32 to 35 are coupled by a plurality of internal buses and their control signals 36 and 37.

In an alternative embodiment, an additional MOS transistor may be connected in series to the MOS transistor formed in each of the light emitting devices 38, so that, when it is not required to observe light emission, the MOS transistor of the light emitting devices 38 is not driven by turning OFF the corresponding additional MOS transistor. Instead of providing such an additional MOS transistor, an adequate switch may be connected to the gate electrode of the MOS transistor formed in each of the light emitting devices 38, thereby enabling the switching of the gate potential of the MOS transistor. In embodiments having such means for forcibly suppressing the light emission of the light emitting devices 38, the power consumption of the semiconductor integrated circuit can be effectively reduced.

Figure 4:
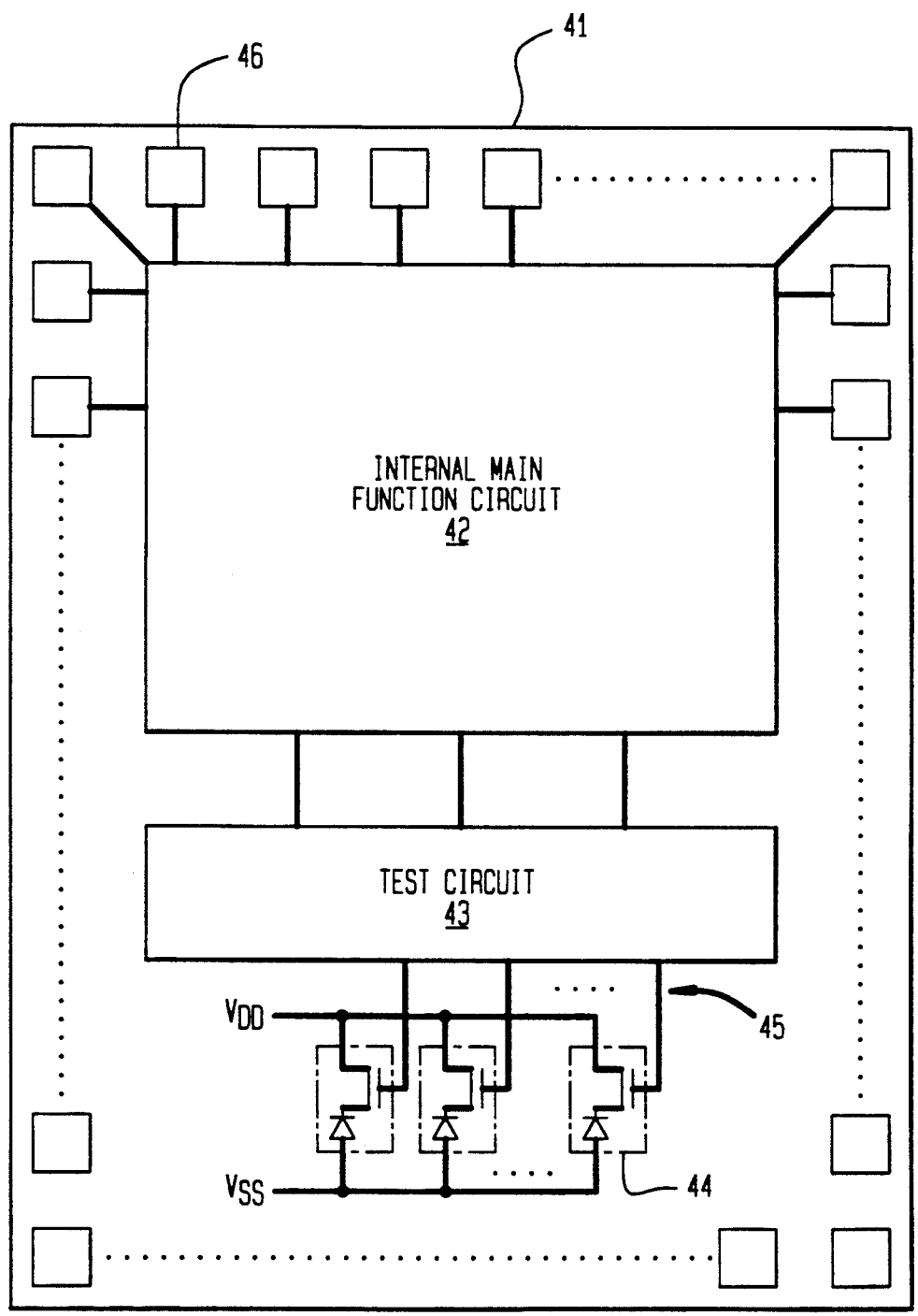

FIG. 4 shows a further semiconductor integrated circuit according to the invention. The semiconductor integrated circuit 41 shown in FIG. 4 comprises an internal main function circuit 42, and a test circuit 43 for testing the functions of the internal main function circuit 42 connected thereto. The internal main function circuit 42 and test circuit 43 constitute an internal main circuit. The output of results 45 from the test circuit 43 is coupled to the gate electrode of a MOS transistor in a light emitting device 44 having the structure shown in FIG. 1A.

The test circuit 43 comprises a test pattern generator, a ROM storing expected patterns corresponding to test patterns, and a comparator for comparing the actual output of the internal main function circuit 42 with the expected patterns. The test results are outputted by the emission/non-emission patterns of the light emitting devices 44, through connection of the comparator's output to the light emitting devices 44.

According to this embodiment, the output of results 45 from the test circuit 43 can be performed without increasing the number of pads 46. When test results are output, it is unnecessary to output the results by means such as time sharing usage of the pads 46, or by converting the output to serial signals, as was done with test circuits in the prior art, and thus the efficiency of testing can be improved.

Figure 5:
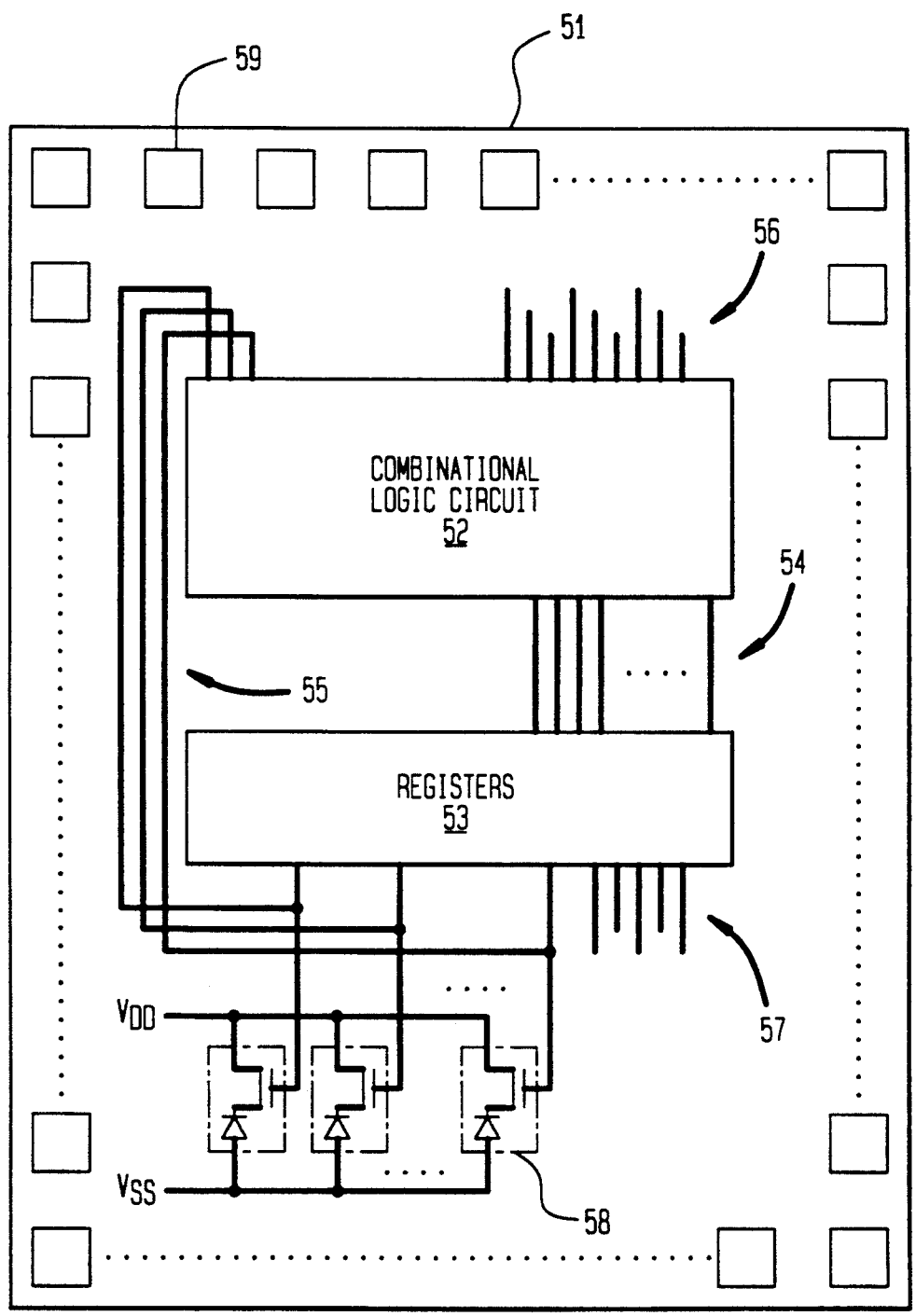

FIG. 5 shows a still further semiconductor integrated circuit according to the invention. In this embodiment, a semiconductor integrated circuit 51 comprises a state transition circuit as an internal main circuit. The state transition circuit consists of a combinational logic circuit 52 and a register group 53 which maintains a previously input state. Outputs 54 of the combinational logic circuit 52 are supplied to the register group 53, and returned to inputs 55 of the combinational logic circuit 52 to form a feedback loop. The inputs 55, i.e., outputs of the register group 53 are coupled to each of the gate electrodes of the MOS transistors in light emitting devices 58 having the structure shown in FIG. 1A. The logic state of the register group 53 is indicated through the combination of emission/non-emission patterns of the light emitting devices 58. In FIG. 5, reference numeral 59 indicates pads.

In the state transition circuit, when signals are supplied to inputs 56 of the combinational logic circuit 52, the results appear in outputs 57 of the combinational logic circuit 52. The state of the outputs 57 depends on the state of the previous inputs 56, because of the existence of the register group 53 which maintains the previous state within the feedback loop. For this reason, checking the state of the register group 53 is effective for efficient debugging, failure analysis and functional testing etc. of the state transition circuit.

According to this embodiment, it is possible to reliably check the state of the register group 53 using a simple structure. Furthermore, since the light emitting devices 58 are small in size, the overall size of the circuit does not significantly increase even when the light emitting devices 58 are connected to each of the components of the register group 53.

Figure 6:
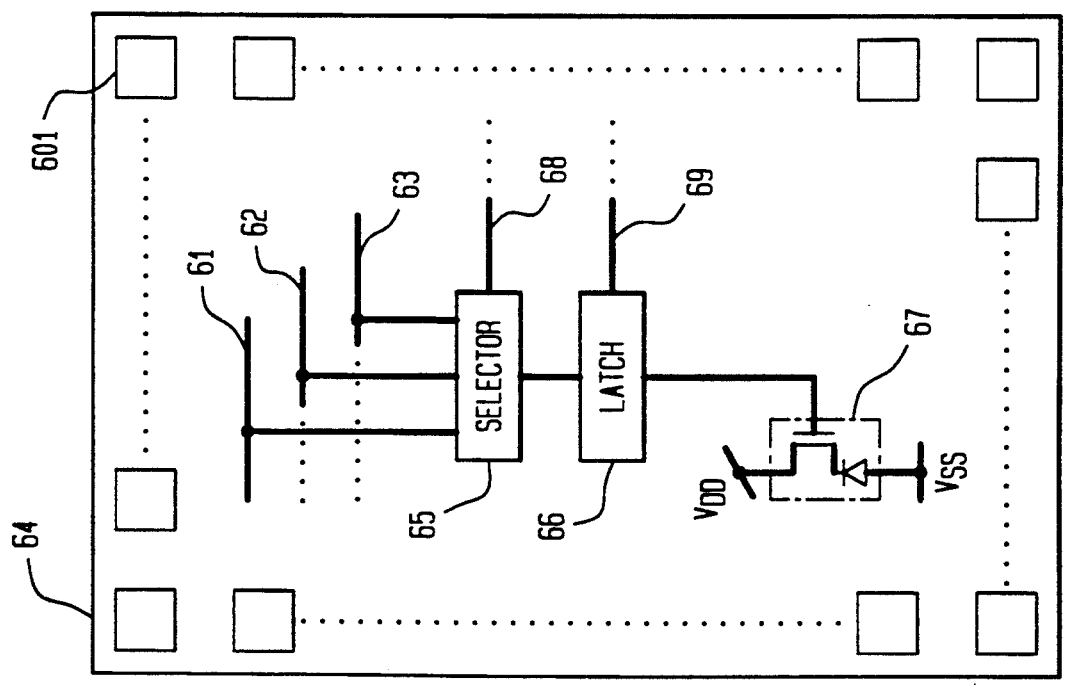

FIG. 6 shows a still further semiconductor integrated circuit according to the invention. In this embodiment, a semiconductor integrated circuit 64 comprises signal lines 61, 62 and 63 which are to be checked and are each connected to an input of a selector 65. The selector 65 selects a signal line and connects it to an input of a latch 66, based upon a control signal 68 which is supplied from either inside or outside the chip. The latch 66 samples input data in accordance with timing based upon a control signal 69 which is supplied from either inside or outside the chip, and maintains the sampled data. The semiconductor integrated circuit 64 further comprises a group of light emitting devices 67 (in FIG. 6, only one light emitting devices 67 is shown) which have the structure shown in FIG. 1A. In FIG. 6, reference numeral 601 indicates pads.

The data sampled by the latch 66 are respectively supplied to the gate electrode of the MOS transistor in one of the light emitting devices 67, and are indicated through the emission/non-emission pattern of the light emitting devices 67.

In this embodiment, since the states of a plurality of signal lines 61, 62 and 63 are observed through time sharing of the same group of light emitting devices 67, it is possible to observe multiple signals by simply observing specific locations within the chip, using a consolidated layout of the light emitting devices 67 within the chip. Therefore, it is possible to eliminate the operation of moving a stage on which the chip is loaded, and thus the efficiency of tasks such as functional testing, failure analysis and debugging can be further improved. Moreover, the latching of data in the latch 66 allows a pattern at the desired time to be selected from the required emission and non-emission time series pattern, and the selected pattern is optically indicated to the outside. In a dynamic circuit, when a pattern is brought to a standstill, the output state breaks down with the passing of time, and thus the latching of data is important for easy measurement.

Figure 7:
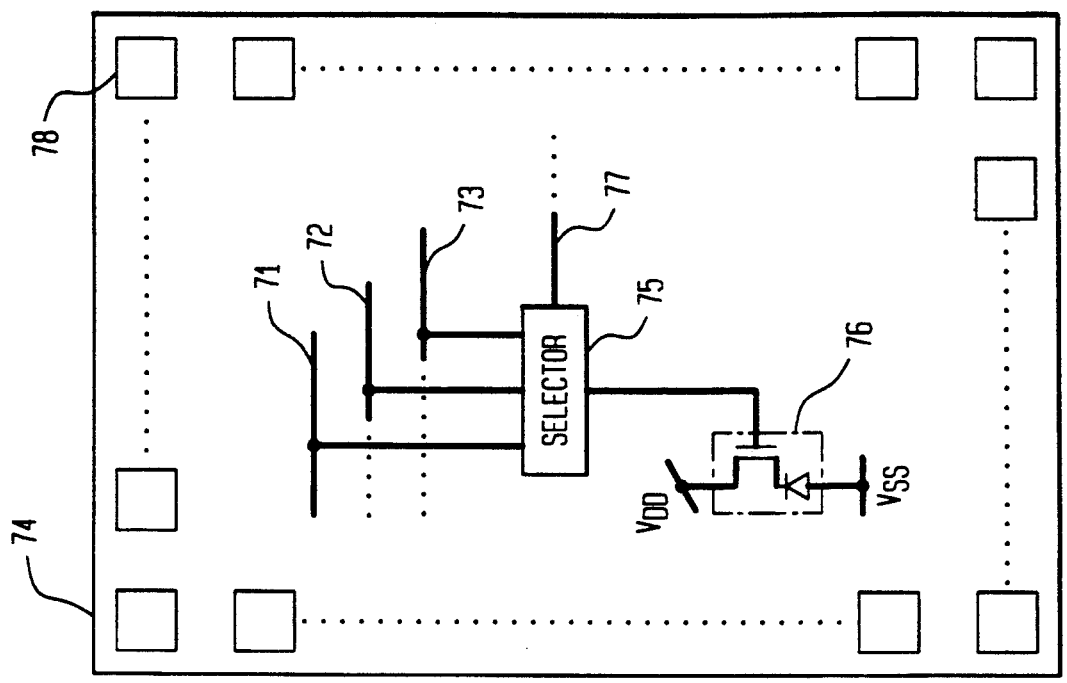

FIG. 7 shows a still further semiconductor integrated circuit according to the invention. In this embodiment, a semiconductor integrated circuit 74 comprises signal lines 71, 72 and 73 which are to be checked and are each connected to an input of a selector 75. The selector 75 selects a signal line, based upon a control signal 77 which is supplied from either inside or outside the chip. The semiconductor integrated circuit 74 further comprises a light emitting device 76 having the structure shown in FIG. 1A. The selector 75 connects the selected line the gate electrode of the MOS transistor in the light emitting device 76. The states of the signal lines 71, 72 and 73 are indicated through the emission/non-emission pattern of the light emitting device 76. In FIG. 7, reference numeral 78 indicates pads.

According to this embodiment, since the states of the signal lines 71, 72 and 73 are observed through time sharing of the light emitting device 76, it is possible to observe multiple signals by simply observing specific location within the chip, using a consolidated layout of a plurality of the light emitting devices 76 within the chip. For this reason, it is possible to eliminate the operation of moving the stage on which the chip is loaded, and thus the efficiency of tasks such as functional testing, failure analysis and debugging is still further improved. Further, in measuring a pattern at the desired time within the time series pattern of emission and non-emission of the light emitting device 76, it is possible for a measuring apparatus to take in the pattern at the desired time only. Furthermore, when the circuit has a static structure, it is possible to observe the pattern of emission/non-emission corresponding to a random time, by bringing to a standstill the test pattern being input to the semiconductor integrated circuit 74.

Figure 8:
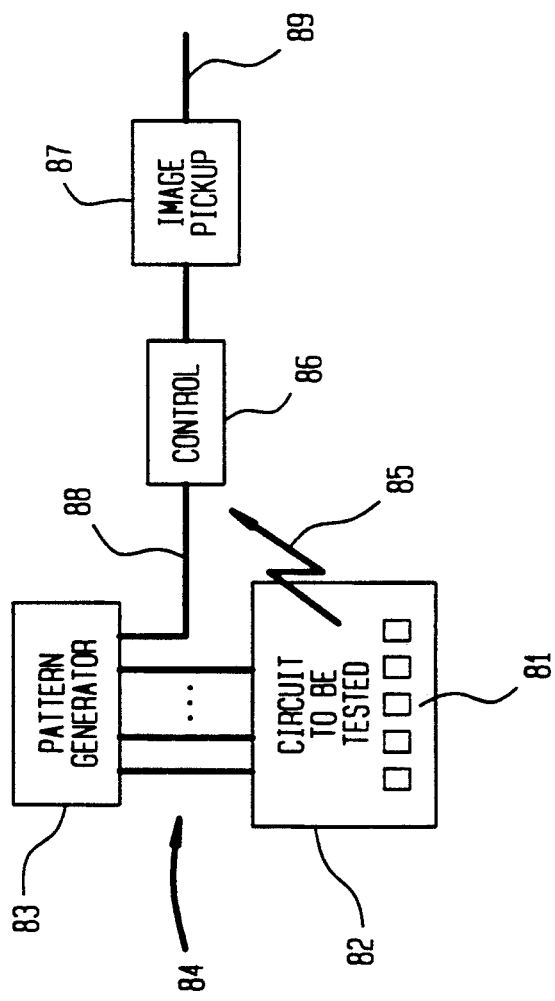
FIG. 8 is a block diagram showing a test apparatus according to the invention.

FIG. 8 shows a test apparatus for testing a semiconductor integrated circuit according to the invention. The test apparatus of FIG. 8 can test a semiconductor integrated circuit having a structure similar to that of the circuit shown in FIG. 2. Namely, the semiconductor integrated circuit 82 to be tested has a group of light emitting devices 81 having the structure shown in FIG. 1. The light emitting devices 81 can indicate the internal state of the circuit, using an emission/non-emission pattern. A pattern generator 83 generates a test pattern 84, and supplies it to the circuit 82 to be tested through pads formed in the periphery of the chip. As a result, a time series pattern 85 of emission/non-emission is generated from the light emitting devices 81. The pattern generator 83 supplies a control signal 88 to a control unit 86 for controlling the light receiving period of an image pickup 87, so that the pattern can be obtained or fetched at a desired time. The timing of the control signal 88 is determined depending upon the test pattern 84. The reference numeral 89 is an output from the image pickup 87.

Figure 9:
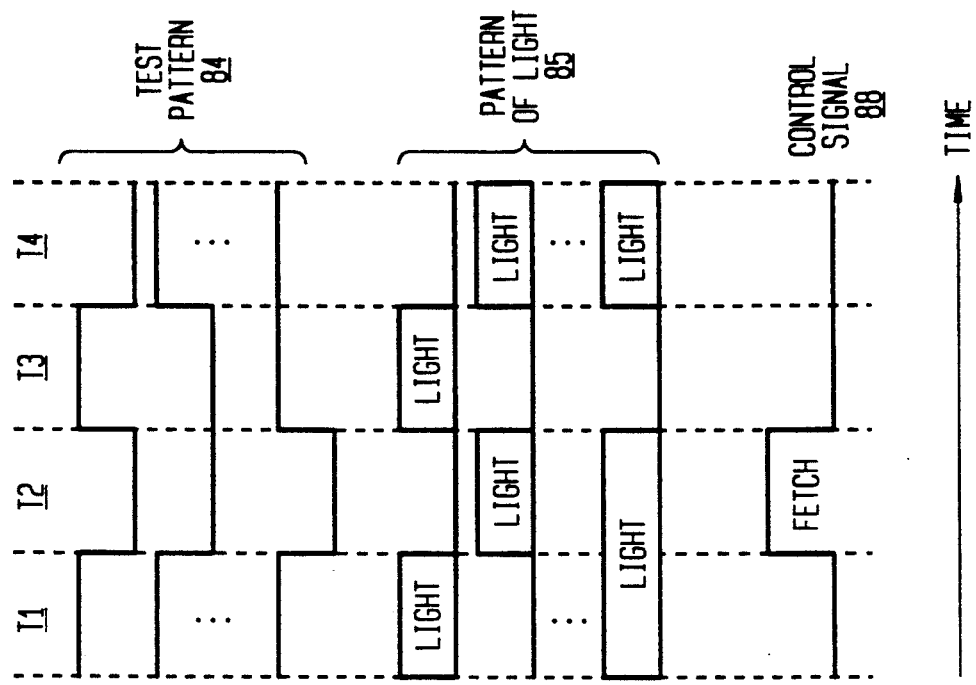
FIG. 9 is a timing chart illustrating the operation of the test apparatus of FIG. 8.

The operation of the test apparatus of FIG. 8 will be described with reference to FIG. 9. FIG. 9 is a time chart showing examples of, at a series of time T1, T2, T3 and T4, the test pattern 84, the pattern of emission/non-emission of light 85 generated from the light emitting devices 81, and the control signal 88 for the control unit 86. Since there is a one-to-one correspondence between the test pattern 84 and the emission/non-emission pattern 85, the control signal 88 may be generated at the desired time in the test pattern 84. In FIG. 9, time T2 is the time at which the emission/non-emission pattern 85 is to be checked or fetched, and the light emissions at the other instants (time T1, T3 and T4) are treated as measurement noises. In order to take in the emission/non-emission pattern 85 at time T2, the control signal 88 is in a fetching state only during the time T2.

In accordance with this embodiment, measurement of the emission/non-emission pattern 85 at the desired time can be performed easily, without taking measures such as providing a special circuit for controlling the light emitting devices 81 in the circuit 82 to be tested to output the emission pattern only at the desired time, or bringing the test pattern 84 to a standstill at the desired time.

In the above description, semiconductor integrated circuits in which the light emitting devices having the structure of FIG. 1A are used have been described. To those skilled in the art, it is apparent from the description that short channel MOS transistors or other known light emitting devices such as GaAs LEDs may be used as the light emitting devices in a semiconductor integrated circuit.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A test apparatus for testing a semiconductor integrated circuit in which at least one light emitting device is integrated, comprising:

a pattern generator for generating and transmitting a plurality of test pattern signals to said integrated circuit to cause said light emitting device to produce an emission/non-emission light pattern that indicates internal state of said integrated circuit;

optical means, including an output terminal, for receiving light emitted from said light emitting device, for generating a further plurality of electric signals which indicate light emission from said light emitting device, and for selectively transmitting at least one of said further plurality of electric signals to said optical means output terminal said pattern generator including signal generation means for generating a timing signal and for transmitting said timing signal to said optical means to selectively enable one or more functions of said optical means so that at least one of said further plurality of electric signals is selectively transmitted to said optical means output terminal.

2. The test apparatus according to claim 1 wherein said timing signal is determined depending on said plurality of test pattern signals.

3. The test apparatus according to claim 2 wherein said integrated circuit comprises a plurality of said integrated light emitting devices, said device producing a light pattern in response to outputs from the integrated circuit to indicate internal states of said integrated circuit.

4. The test apparatus according to claim 1, wherein detection of said at least one of said further plurality of electric signals at said optical means output terminal indicates correct operation of said semiconductor integrated circuit.

* * * * *

UNITED STATES PATENT AND TRADEMARK OFFICE
CERTIFICATE OF CORRECTION

PATENT NO.    : 5,270,655
DATED         : December 14, 1993
INVENTOR(S)   : Tomita It is certified that error appears in the above-identified patent and that said Letters Patent is hereby corrected as shown below:

Column 12, line 3, delete "device" and insert --devices--.

Signed and Sealed this

First Day of November, 1994

Attest:

BRUCE LEHMAN

Attesting Officer    Commissioner of Patents and Trademarks